July 14, 1964 V. MOLL 3,140,683

ALLOYING FIXTURE

Filed July 5, 1961

INVENTOR
VALENTIN MOLL

BY Francis L. Masselle
ATTORNEY

United States Patent Office 3,140,683
Patented July 14, 1964

3,140,683
ALLOYING FIXTURE

Valentin Moll, Freiburg im Breisgau, Germany, assignor to Clevite Corporation, a corporation of Ohio Filed July 5, 1961, Ser. No. 123,367
Claims priority, application Germany July 6, 1960
7 Claims. (Cl. 113—99)

This invention relates to alloying fixtures for semiconductor devices and particularly devices, such as transistors, which have alloyed PN junctions and/or ohmic base contacts formed on opposite sides of a semiconductor wafer.

As used herein, "contacts" is intended to embrace rectifying junctions as well as ohmic contacts.

The invention will be described, solely for the purposes of example, with references to a conventional transistor configuration comprising circular rectifying junctions disposed in coaxial relation on respective surfaces of a semiconductor wafer.

One of the most widely used methods for fabricating semiconductive devices at the present time involves the alloying of pellets of conductivity-type determinants to a wafer of semiconductor material. Alloying is customarily accomplished by disposing the wafer of semiconductor material and the alloying pellets in proper relative positions in an alloying jig which insures intimate physical contact between the pellets and the respective surfaces of the wafer, and placing the loaded jig in an alloying furnace. Conveniently, the non-rectifying electrode or base contact may be applied at the same time.

In the formation of PN junctions by alloying it is important that the alloying metal wet the surface of the semiconductor wafer; poor wetting during alloying yields semiconductor devices having inferior electrical properties. With alloying techniques heretofore generally employed, it is usually evident that better wetting occurs on the upper surface of the wafer than on the lower, the designation "upper" and "lower" having reference to the wafer position while in the alloying furnace.

The difference in wetting is generally attributed to dissimilarity in contact pressure existing between the upper alloying pellet and the top surface of the wafer as compared with that between the alloying pellet beneath, and contacting lower surface of, the wafer. This pressure difference stems from the fact that the alloy pellets disposed under the wafer are placed in recesses in the surface supporting the wafer which serve to locate and define the region of the wafer surface to be alloyed. An alloying fixture having such a recess is shown in U.S. Letters Patent 2,862,470 to J. R. Williams.

Due to the necessary commercial tolerances on the dimensions of the recesses and the volume of the alloy pellets, there is lack of uniformity in the resultant pressures. The problem of equalizing alloying pressures can be avoided by a technique known as "double alloying," i.e., performing the alloying in two steps, inverting the wafer between furnace passes, so that the wafer surface being alloyed is uppermost each time. This expedient, however, is undesirable from the standpoint of manufacturing economy for obvious reasons.

Another problem encountered in alloying transistors, one which is not solved and may be aggravated by double alloying, stems from the need for disposing the opposed emitter and collector junctions coaxially with as high a degree of accuracy as possible. The alloying pellets used in mass production are spheroids and experience has shown that in order to establish satisfactory wetting relation between the lower pellet and the underside of the wafer, the diameter of the surface region to be alloyed should be 1½ to 2 times as large as that of the pellet. Inasmuch as the region to be wet is defined and bounded by the recess in which the pellet is disposed, at least that part of the recess contiguous to the under surface of the wafer must also exceed the pellet diameter by a factor of 1½ to 2. Where the recess is cylindrical, as in the Williams patent referred to hereinabove, the relatively large clearance existing between its side walls and the pellet contained therein makes accurate centering difficult and results in undesirably large deviations from the desired concentricity of the emitter and collector junctions. Improved centering of the pellet is achieved by making the pellet-containing recess in conical form with a downwardly directed apex. While this solves the problem of centering the sloping sides of the recess do not produce as sharply defined a boundary for the alloyed region as is desired and attained with the cylindrical recess.

Both conical and cylindrical recesses have a further, common disadvantage: the alloying pellet when disposed in either form of recess projects above the surface which supports the wafer during alloying. As a result it interferes with the positioning of the wafer and is deformed by pressure applied by the jig creating a flat on the pellet which makes surface contact with the wafer. This surface contact between the deformed pellet and wafer is undesirable because it precludes entry of the reducing atmosphere customarily supplied during alloying to scavenge oxide layers customarily present on the surface of the pellet. Inasmuch as the reducing atmosphere cannot reach the innermost regions of surface contact between the pellet and wafer, wetting is impeded preventing uniform alloying and creating an uneven interface between the alloyed region and the wafer. In addition there is also an increased possibility of obtaining included gas bubbles by subsequent reduction of the enclosed oxide both at the alloy interfaces and in the re-crystallized zone.

It is the fundamental general object of the present invention to overcome or mitigate at least one of the problems of the prior art as outlined hereinabove.

A more specific object is the provision of improved alloying fixtures which combine the merits of both cylindrical and conical pellet-containing recesses while averting their respective disadvantages.

Another object is the provision of novel alloying fixtures for semiconductor devices which enable precise location of the alloyed region on the semiconductor wafer and, concomitantly, the attainment of a high degree of concentricity between junctions formed by alloying pellets on opposite sides of the wafer.

Another object is the provision of improved alloying fixtures for semiconductor devices which do not interfere with the removal of surface oxide in the region of contact between the alloying pellet and wafter during alloying.

These and other objects are accomplished by alloying fixtures in accordance with the present invention which comprise a member having a surface adapted to support a wafer of semiconductor material and, in the surface, a recess for the reception of alloying material. The recess is made up of coaxial segments of different cross-sectional dimensions one of which, adjoining the wafer supporting surface, is cylindrical and connects with a second segment of smaller cross-section so as to define a shoulder for supporting an alloying pellet at the junction of the segments.

Further objects of the invention, its advantages, scope, and the manner in which it may be practiced will be more readily apparent to persons conversant with the art from the following description and subjoined claims taken in conjunction with the annexed drawing in which like reference characters denote like parts throughout the several views and in which:

Figure 1:
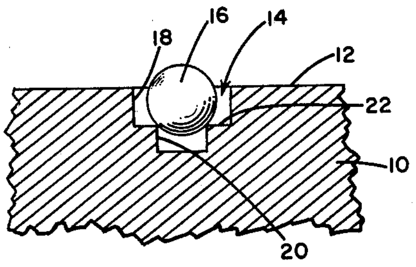
FIGURE 1 is a fragmental sectional view, diagrammatic in form, showing one member of an alloying fixture embodying the present invention.

Referring to FIGURE 1, reference numeral 10 designates a fragment of one member of an alloying fixture, such as an alloying boat, or a jewel employed to dispose a pellet of alloying material in contact with the surface of a semiconductor wafer during alloying as disclosed in copending application for U. S. Letters Patent Serial No. 819,364, filed June 10, 1959, and assigned to the same assignee as the present invention. Considering 10 a fragment of an alloying boat, it will be understood that, in volume production, it is customary to employ relatively large boats capable of holding a number of alloying assemblies. Viewing 10 as a jewel or corundum element such as employed in the aforementioned application Serial No. 819,364, it may be one of a large number of such elements used in conjunction with additional fixture components in an assembly capable of handling relatively large numbers of wafers to be alloyed. In any event, member 10 represents a fixture component which supports and positions an alloying pellet in position relative to a wafer of semiconductive material during the alloying step; accordingly, the member is made up of any suitable material which is not wet by nor reactive with the alloying material with which it comes in contact.

Member 10 has a surface 12 for supporting a wafer of semiconductor material during alloying and contains a recess 14 for the reception of a pellet 16 of the alloying material. In accordance with the present invention recess 14 takes the form of a stepped bore or cavity made up of aligned segments 18, 20 of different cross-sectional dimensions. Segment 18 is cylindrical in configuration and has a diameter exceeding that of alloying pellet 20 disposed therein.

As previously mentioned the diameter of the wafer surface to be wet by the alloying pellet is approximately 1.5 to 2 times greater than the pellet diameter. Inasmuch as the wetted surface is defined by the diameter of segment 18, which adjoins and has one end open to surface 12 on which the wafer is supported, the diameter of this segment is likewise 1½ to 2 times greater than that of the alloying pellet.

Figure 2:
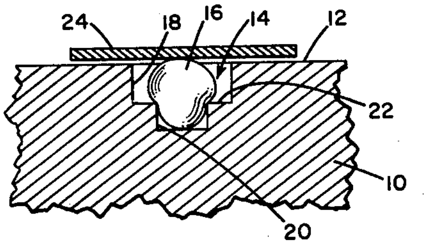
FIGURE 2 is a view similar to FIGURE 1 illustrating the fixture member with a wafer of semiconductor in position for alloying.

Segment 20 is of smaller cross-section than segment 18, at least at the region of its junction with the latter, so as to form at such junction a step or shoulder 22. In the illustrated embodiment segment 20 is shown as being of cylindrical configuration but, as will be seen as the description proceeds, this is not necessarily the case. It is essential only that the configuration of segment 20 be such that its junction with segment 18 creates a shoulder 22 at least the inner edge or edges of which are disposed symmetrically about and equispaced from the central axis of segment 18.

Where the cross-section of segment 20, at least where it adjoins segment 18, is circular, shoulder 22 and its inner edge are annular and concentric with the axis of segment 18. Consequently, alloy pellet 16, when disposed in recess 14, lodges on the inner edges of shoulder 22 and is thus precisely centered with respect to segment 18. In this position, the upper part of pellet 16 protrudes above surface 12 as in the case of prior art apparatus alluded to hereinabove. However, when a wafer 24 is pressed into position on surface 12, deformation of pellet 16 takes place in the form of extrusion of part of its lower hemisphere into recess segment 20, as shown in FIGURE 2, rather than flattening of the upper surface as previously described. Thus, the spherical form of the pellet is preserved at the region of its contact with wafer 24 allowing access of reducing atmosphere provided during alloying to substantially the entire surface of the pellet.

Figure 3:
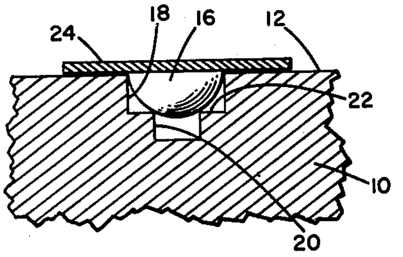
FIGURE 3 is a view similar to FIGURES 1 and 2 showing the fixture member and its contents subsequent to fusion of the alloying pellet.

FIGURE 3 illustrates the form of the pellet and its relation to the wafer after fusion occurs. Due to surface tension, the part of pellet 16 theretofore deformed into segment 20 of the recess, is drawn up, thte molten pellet assuming a hemispheroidal configuration, and alloying pressure is provided. It will be seen, therefore, that segment 20 can extend entirely through member 16, as surface tension will prevent the melt from running out of the recess.

From the description thus far, it will be appreciated that the cross-sectional dimensions of recess segment 20, the size of pellet 16 and the depth and diameter of recess segment 18 are inter-related parameters, selected and adjusted to suit the particular device being alloyed and achieve satisfactory results.

Figure 4:
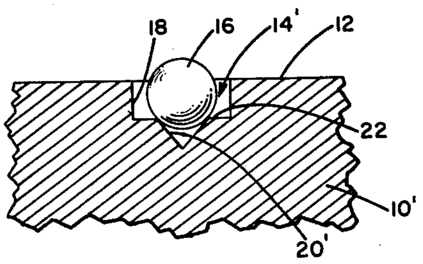
FIGURE 4 is a view similar to FIGURE 1 illustrating a modified embodiment of the invention.

As previously mentioned, recess segment 20 need not be cylindrical; the many possible variations are exemplified by the modified form of alloying member 10' shown in FIGURE 4, which is in all respects identical to that already described in detail except that the smaller segment 20' of recess 14' takes the form of a right circular cone having its base adjoining segment 18 and perpendicular to its axis.

Alloying fixture members 10 and 10', and modifications thereof, can take two principal structural forms: (1) monolithic-fabricated by counter-boring or otherwise forming the respective segments in a single piece of material—or (2) laminated-made by forming the recess segments in separate plates of material which are subsequently superposed with individual segments registered and aligned.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed and desired to be secured by United States Letters Patent is:

1. A fixture for alloying a pellet onto a semiconductor wafer including: a member having a surface adapted to support a wafer of semiconductor material; means defining in said surface a pellet receiving recess comprising coaxial segments of different cross-sectional dimension, one of said segments being cylindrical in configuration and having one end opening at said surface and its opposite end joining a second segment of smaller cross-section than said one segment and defining, by means of, and at, the junction therewith, a shoulder circumscribing, and having inner edges equispaced from, the longitudinal axis of said one segment, said shoulder having a diameter less than that of the pellet to retain and support the pellet during alloying thereof to the wafer.

2. An alloying fixture in accordance with claim 1 wherein the diameter of said first segment is substantially greater than that of a spheroid alloying pellet to be alloyed to such a wafer and the inner dimension of said shoulder is smaller than the diameter of such a pellet.

3. A fixture for alloying a spheroid pellet onto a semiconductor wafer to form a rectifying junction including: a member having a surface adapted to support a wafer of semiconductor material; means defining in said surface a pellet receiving recess comprising coaxial segments of different cross-sectional dimension, one of said segments being of cylindrical configuration with a diameter substantially larger than that of the pellet, said one segment having one end opening at said surface and its opposite end joining a second segment of smaller cross-section than the diameter of the pellet and defining, by means of, and at, the junction with said one segment, a shoulder circumscribing and having inner edges equispaced from, the longitudinal axis of said one segment said shoulder having a diameter less than that of the pellet to retain and support the pellet during alloying thereof to the wafer.

4. A fixture for alloying a spheroid pellet onto a semiconductor wafer, to form a rectifying junction, including: a member having a surface adapted to support a wafer of semiconductor material; means defining in said surface a pellet receiving recess comprising coaxial segments of different cross-sectional dimension, one of said segments being of cylindrical configuration with a diameter substantially larger than that of the pellet, said one segment having one end opening at said surface and its opposite end joining a second segment of circular cross-section and smaller diameter than that of the pellet and defining, by means of, and at, the junction with said one segment, an annular shoulder concentric with the axis of said first segment said shoulder having a diameter less than that of the pellet to retain and support the pellet during alloying thereof to the wafer.

5. An alloying fixture in accordance with claim 4 wherein said second segment is in the form of a cone with its apex directed away from said one segment.

6. An alloying fixture in accordance with claim 4 wherein said second segment is of cylindrical configuration.

7. A fixture for alloying a spheroid pellet onto a semiconductor wafer comprising: a member having a surface adapted to support a wafer of semiconductor material; a pellet receiving recess in said surface comprising coaxial segments of different cross-sectional dimension, said recess comprising a first cylindrical segment extending from said surface having a depth substantially less than the diameter of the pellet and a diameter substantially larger than the diameter of the pellet, said recess comprising a second segment of smaller cross-section extending from the end of said first segment coaxially therewith and defining at the junction of said segments a coaxial annular shoulder of smaller diameter than the pellet to be engaged by the pellet and support the same in equispaced relationship with the peripheral wall of said first recess segment and with a portion thereof above the plane of said surface to be engaged by the wafer.

References Cited in the file of this patent

UNITED STATES PATENTS

| | | |
|---|---|---|
| 2,743,693 | Schaper | May 1, 1956 |
| 2,862,470 | Williams | Dec. 2, 1958 |
| 2,879,188 | Strull | Mar. 24, 1959 |
| 2,939,205 | Sutherland et al. | June 7, 1960 |
| 2,942,568 | Hamilton et al. | June 28, 1960 |